United States Patent
Kiyono et al.

(10) Patent No.: US 10,177,108 B2
(45) Date of Patent: Jan. 8, 2019

(54) METHOD OF MANUFACTURING ELECTRONIC COMPONENT MODULE AND ELECTRONIC COMPONENT MODULE

(71) Applicant: MURATA MANUFACTURING CO., LTD., Kyoto-fu (JP)

(72) Inventors: Shinya Kiyono, Nagaokakyo (JP); Yoshiaki Satake, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/353,362

(22) Filed: Nov. 16, 2016

(65) Prior Publication Data

US 2017/0084566 A1    Mar. 23, 2017

Related U.S. Application Data (60) Division of application No. 14/062,767, filed on Oct. 24, 2013, now Pat. No. 9,532,495, which is a
(Continued)

(30) Foreign Application Priority Data

Apr. 27, 2011 (JP) .................. 2011-099951

(51) Int. Cl.
*H05K 3/34* (2006.01)
*H05K 1/18* (2006.01)
(Continued)

(52) U.S. Cl.
CPC .......... *H01L 24/17* (2013.01); *H01L 21/4853* (2013.01); *H01L 23/3142* (2013.01);
(Continued)

(58) Field of Classification Search
CPC .... H05K 3/341; H05K 13/0465; H05K 1/181; H05K 3/3457
See application file for complete search history.

(56) References Cited

U.S. PATENT DOCUMENTS 4,997,122 A   3/1991 Zimmer
5,291,375 A   3/1994 Mukai
(Continued)

FOREIGN PATENT DOCUMENTS

EP   1 720 389 A2   11/2006
JP   H11-251473 A   9/1999
(Continued)

OTHER PUBLICATIONS

The extended European search report issued by the European Patent Office dated Sep. 30, 2014, which corresponds to European Patent Application No. 12775989.2-1552 and is related to U.S. Appl. No. 14/062,767.
(Continued)

*Primary Examiner* — Nathan Milakovich
(74) *Attorney, Agent, or Firm* — Studebaker & Brackett PC (57) ABSTRACT

A method of manufacturing an electronic component module and the electronic component module manufactured by the manufacturing method includes bumps, each including a thicker portion having a relatively large thickness and a thinner portion having a relatively small thickness and formed on one surface of the substrate. When looking at the electronic component in a mounted state in a plan view, the thicker portion is positioned on a side of a corresponding outer terminal closer to a center of the electronic component and the thinner portion is positioned on the opposite side of the corresponding outer terminal. In the plan view, joining portions joining the outer terminals respectively to the bumps are formed such that a height of each joining portion
(Continued)

on the opposite side is lower than a height of the joining portion on the side closer to the center of the electronic component.

9 Claims, 8 Drawing Sheets

Related U.S. Application Data continuation of application No. PCT/JP2012/059305, filed on Apr. 5, 2012.

(51) Int. Cl.
| | |
|---|---|
| *H05K 13/04* | (2006.01) |
| *H01L 23/00* | (2006.01) |
| *H01L 23/498* | (2006.01) |
| *H01L 21/48* | (2006.01) |
| *H01L 23/31* | (2006.01) |

(52) U.S. Cl.
CPC .... *H01L 23/4985* (2013.01); *H01L 23/49811* (2013.01); *H01L 23/49816* (2013.01); *H01L 23/49838* (2013.01); *H01L 24/06* (2013.01); *H01L 24/13* (2013.01); *H01L 24/14* (2013.01); *H01L 24/16* (2013.01); *H01L 24/81* (2013.01); *H05K 1/181* (2013.01); *H05K 3/341* (2013.01); *H05K 13/0465* (2013.01); H01L 2224/0401 (2013.01); H01L 2224/05124 (2013.01); H01L 2224/05553 (2013.01); H01L 2224/05568 (2013.01); H01L 2224/05624 (2013.01); H01L 2224/1134 (2013.01); H01L 2224/1146 (2013.01); H01L 2224/11312 (2013.01); H01L 2224/11318 (2013.01); H01L 2224/11505 (2013.01); H01L 2224/11515 (2013.01); H01L 2224/13017 (2013.01); H01L 2224/13139 (2013.01); H01L 2224/13144 (2013.01); H01L 2224/13147 (2013.01); H01L 2224/1411 (2013.01); H01L 2224/16052 (2013.01); H01L 2224/16058 (2013.01); H01L 2224/16105 (2013.01); H01L 2224/16225 (2013.01); H01L 2224/16227 (2013.01); H01L 2224/16238 (2013.01); H01L 2224/1703 (2013.01); H01L 2224/17104 (2013.01); H01L 2224/17107 (2013.01); H01L 2224/73204 (2013.01); H01L 2224/8112 (2013.01); H01L 2224/8114 (2013.01); H01L 2224/81193 (2013.01); H01L 2224/81194 (2013.01); H01L 2224/81203 (2013.01); H01L 2224/81439 (2013.01); H01L 2924/00014 (2013.01); H01L 2924/01028 (2013.01); H01L 2924/01029 (2013.01); H01L 2924/01047 (2013.01); H01L 2924/01079 (2013.01); H01L 2924/3025 (2013.01); H01L 2924/3841 (2013.01); *H05K 3/3457* (2013.01); H05K 2203/0278 (2013.01); Y02P 70/613 (2015.11)

(56) References Cited

U.S. PATENT DOCUMENTS

| | | | | |
|---|---|---|---|---|
| 5,400,950 | A | * | 3/1995 | Myers ............... H01L 24/81 |
| | | | | 228/180.22 |
| 5,428,505 | A | | 6/1995 | Sakemi et al. |
| 5,663,529 | A | | 9/1997 | McMillan et al. |
| 6,229,711 | B1 | | 5/2001 | Yoneda |
| 8,338,715 | B2 | | 12/2012 | Hirano et al. |
| 9,095,066 | B2 | | 7/2015 | Kusumoto |
| 9,455,240 | B2 | * | 9/2016 | Konno ............... H01L 24/743 |
| 2001/0030061 | A1 | | 10/2001 | Yoneda |
| 2004/0262753 | A1 | | 12/2004 | Kashiwazaki |
| 2006/0237229 | A1 | | 10/2006 | Sugahara |
| 2006/0289972 | A1 | * | 12/2006 | Nishimura ........ H01L 21/563 |
| | | | | 257/666 |
| 2009/0056985 | A1 | | 3/2009 | Hirano et al. |
| 2009/0302463 | A1 | | 12/2009 | Gallegos et al. |
| 2009/0321499 | A1 | | 12/2009 | Morita et al. |
| 2011/0101497 | A1 | | 5/2011 | Bizen et al. |
| 2011/0185566 | A1 | | 8/2011 | Sugahara |
| 2017/0150605 | A1 | * | 5/2017 | Nagai ............... H05K 1/181 |

FOREIGN PATENT DOCUMENTS

| | | |
|---|---|---|
| JP | 2004-228375 A | 8/2004 |
| JP | 2008-060483 A | 3/2008 |
| WO | 2008/026504 A1 | 3/2008 |

OTHER PUBLICATIONS

International Search Report; PCT/JP2012/059305; dated May 15, 2012.
Written Opinion of the International Searching Authority; PCT/JP2012/059305; dated May 15, 2012.
Communication Pursuant to Article 94(3) EPC issued by the European Patent Office dated Jun. 27, 2018, which corresponds to 12 775 989.2-1212 and is related to U.S. Appl. No. 15/353,362.

* cited by examiner

Prior Art

APPLY PRESSURE AND HEAT

METHOD OF MANUFACTURING ELECTRONIC COMPONENT MODULE AND ELECTRONIC COMPONENT MODULE

CROSS REFERENCE TO RELATED APPLICATIONS

The present application is a Divisional Application of U.S. patent application Ser. No. 14/062,767 filed on Oct. 24, 2013, which is a continuation of International Application No. PCT/JP2012/059305 filed on Apr. 5, 2012, and claims priority to Japanese Patent Application No. 2011-099951 filed on Apr. 27, 2011, the contents of each of these applications being incorporated herein by reference in their entirety.

TECHNICAL FIELD

The technical field relates to a method of manufacturing an electronic component module, the method being used to respectively join a plurality of outer terminals of an electronic component to a plurality of bumps provided on one surface of a substrate, and also relates to the electronic component module manufactured by the manufacturing method.

BACKGROUND

Figures 1A, 1B, 1C:
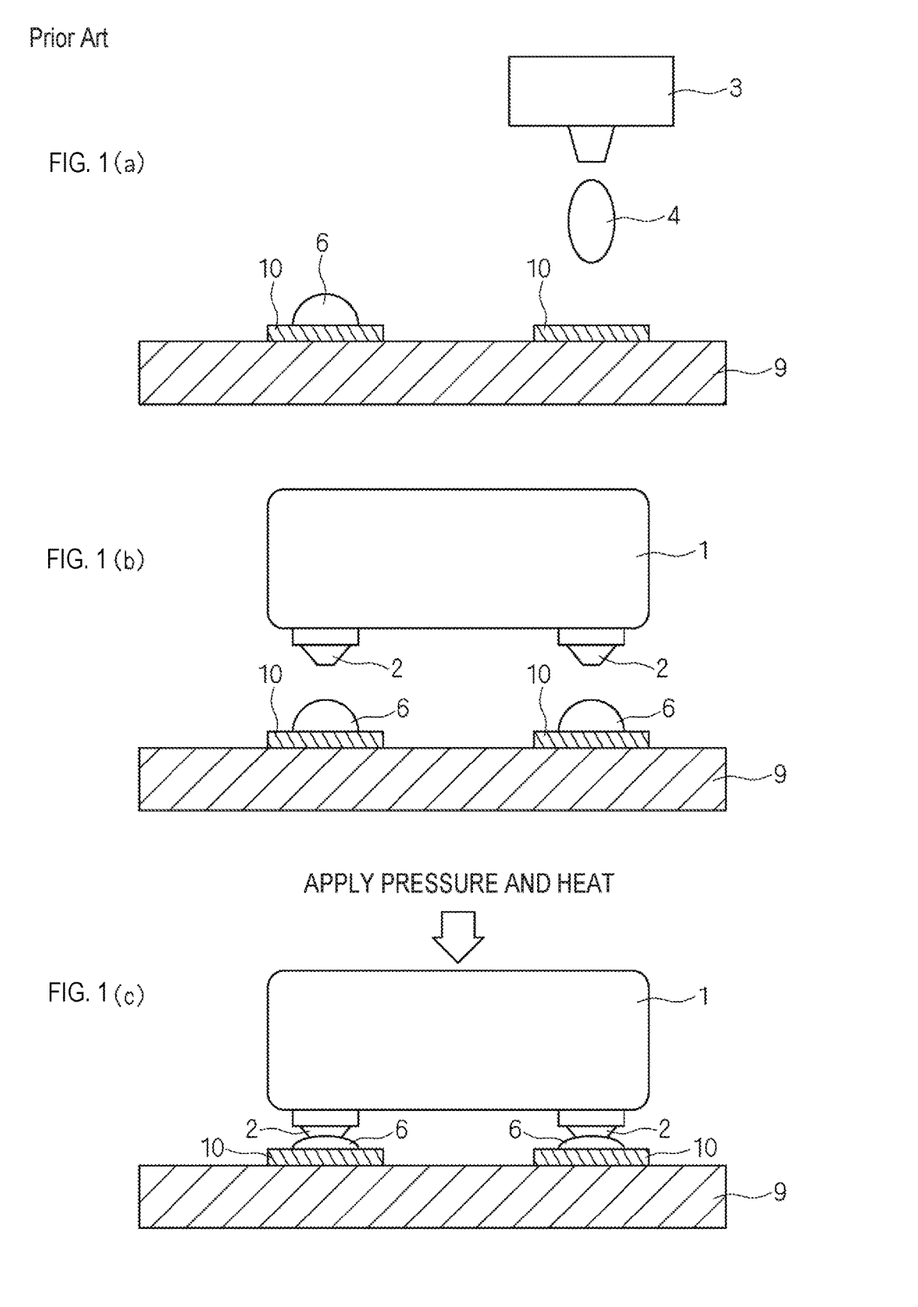
FIGS. 1(a) to 1(c) are schematic sectional views illustrating a related-art method of manufacturing an electronic component module.

Japanese Unexamined Patent Application Publication No. 2004-228375 (Patent Document 1) discloses a method of forming bumps when a semiconductor is joined to a substrate with the bumps interposed between them. FIG. 1 is a schematic sectional view illustrating a related-art method of manufacturing an electronic component module. In Patent Document 1, as illustrated in FIG. 1(a), a bump 6 is formed on a surface electrode 10 of a substrate 9 by ejecting a metal paste 4 from an ink head 3 and by drying the metal paste 4.

Next, as illustrated in FIG. 1(b), outer terminals 2 of a bare IC (i.e., an electronic component provided with outer terminals) 1 are aligned to face the bumps 6 on the substrate 9, respectively. Furthermore, as illustrated in FIG. 1(c), the bare IC 1 is placed on the substrate 9, and the outer terminals 2 are joined to the bumps 6, respectively, by applying pressure and heat to such an extent that the bumps 6 are deformed. The bare IC 1 is thus mounted to the substrate 9.

SUMMARY

The present disclosure provides a method of manufacturing an electronic component module in which joining portions joining a plurality of outer terminals of an electronic component and a plurality of surface electrodes of a substrate are not contacted with a lateral surface of the electronic component, and to provide the electronic component module manufactured by the manufacturing method.

In an embodiment the present disclosure, a method of manufacturing an electronic component module, the method being used to join a plurality of outer terminals of an electronic component respectively to a plurality of bumps provided on one surface of a substrate, the method comprising the steps of forming, on the one surface of the substrate, the plural bumps such that each bump includes a thicker portion having a relatively large thickness and a thinner portion having a relatively small thickness, and that, when looking at the electronic component in a mounted state in a plan view, the thicker portion is positioned on side closer to a center of the electronic component relative to corresponding one of the outer terminals, and the thinner portion is positioned on opposite side away from the center of the electronic component relative to the corresponding outer terminal, and forming a plurality of joining portions, which join the plural outer terminals respectively to the plural bumps, having been formed in the preceding step, through deformation of the bumps, such that a height of each joining portion on the opposite side away from the center of the electronic component when looking at the mounted electronic component in a plan view is lower than a height of the joining portion on the side closer to the center of the electronic component.

With the feature mentioned above, each of the plural bumps includes the thicker portion having a relatively large thickness and the thinner portion having a relatively small thickness. Each bump is formed on one surface of the substrate such that, when looking at the electronic component in a mounted state in a plan view, the thicker portion is positioned on the side closer to a center of the electronic component relative to corresponding one of the outer terminals, and the thinner portion is positioned on the opposite side away from the center of the electronic component relative to the corresponding outer terminal. The plural joining portions joining the plural outer terminals respectively to the plural bumps, having been formed in the preceding step, through deformation of the bumps are formed such that a height of each joining portion on the opposite side away from the center of the electronic component when looking at the mounted electronic component in a plan view is lower than a height of the joining portion on the side closer to the center of the electronic component. Therefore, the joining portions are avoided from contacting with lateral surfaces of the electronic component. Thus, even when an internal wiring of the electronic component is exposed at the lateral surfaces of the electronic component due to dicer cutting, characteristics of the electronic component do not degrade.

In a more specific embodiment of the method of manufacturing the electronic component module, each of the plural bumps may be formed in a stepped shape.

With the feature mentioned above, since the plural bumps are each formed in a stepped shape, the joining portions can be formed such that the height of each joining portion on the opposite side away from the center of the electronic component when looking at the mounted electronic component in a plan view is lower than the height of the joining portion on the side closer to the center of the electronic component. Therefore, the joining portions are avoided from contacting with the lateral surfaces of the electronic component. Thus, even when the internal wiring of the electronic component is exposed at the lateral surfaces of the electronic component due to dicer cutting, characteristics of the electronic component do not degrade.

In the method of manufacturing the electronic component module according to the present invention, preferably, the plural bumps are formed by an ink jet method.

In another embodiment, an electronic component module includes a substrate, a plurality of bumps provided on one surface of the substrate, an electronic component having a plurality of outer terminals, and a resin sealing surroundings of a plurality of joining portions which join the plural outer terminals respectively to the plural bumps through deformation of the bumps. The plural joining portions are formed such that a height of each joining portion on opposite side away from a center of the electronic component when looking at the electronic component module in a plan view is lower than a height of the joining portion on side closer to the center of the electronic component module.

In a more specific embodiment of the electronic component module, preferably, the plural bumps are formed in pairs at opposed positions symmetrical with respect to the center of the electronic component when looking at the electronic component in a plan view.

DETAILED DESCRIPTION

The inventors realized that with the related-art manufacturing method described above with respect to Patent Document 1, for example, when the bump 6 is formed in a relatively large thickness, there is a possibility that the deformed bump 6 may extend up to a lateral surface of the bare IC 1, and electrical conduction may occur between the surface electrode 10 of the substrate 9 and an internal wiring of the bare IC 1. Thus, the electronic component module manufactured by the related-art manufacturing method, described above, has a risk that characteristics of the bare IC 1 may degrade.

Figure 2:
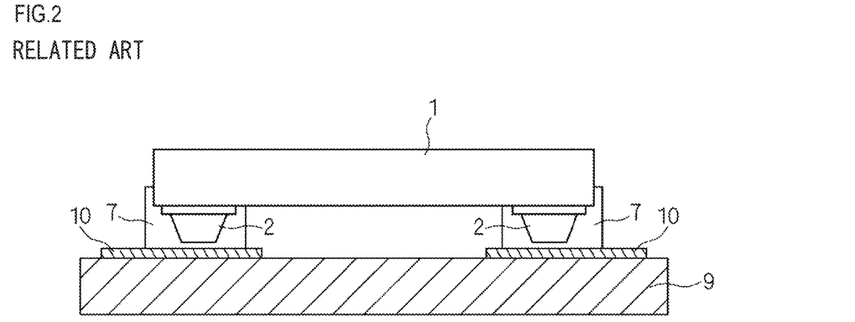
FIG. 2 is a sectional view illustrating a structure of the electronic component module manufactured by the related-art manufacturing method.

FIG. 2 is a sectional view illustrating a structure of the electronic component module manufactured by the related-art manufacturing method. When the bump 6 is formed in a relatively large thickness, a joining portion 7 between the outer terminal 2 of the bare IC 1 and the surface electrode 10 of the substrate 9 is caused to extend up to the lateral surface of the bare IC 1, and the joining portion 7 comes into contact with the lateral surface of the bare IC 1. If chipping occurs in dicer cutting of the bare IC 1, the internal wiring is often exposed at the lateral surface of the bare IC 1. In such a case, the contact of the joining portion 7 with the lateral surface of the bare IC 1 causes electrical conduction between the surface electrode 10 of the substrate 9 and the internal wiring of the bare IC 1. As a result, the characteristics of the bare IC 1 degrade.

An exemplary embodiment of the present disclosure that can address the above shortcomings will now be described in detail with reference to the drawings.

Figure 3:
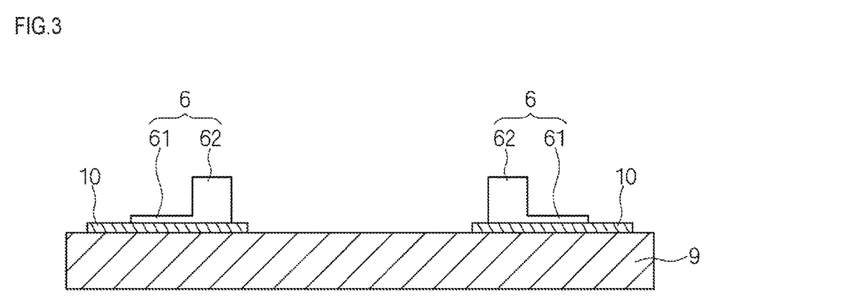
FIG. 3 is a sectional view illustrating a structure of an electronic component module, in a state before mounting of a bare IC, according to an exemplary embodiment of the present disclosure.

FIG. 3 is a sectional view illustrating a structure of an electronic component module, in a state before mounting of a bare IC, according to an exemplary embodiment. As illustrated in FIG. 3, a surface electrode 10 is provided on one surface of a substrate 9, and a bump 6 is formed in a stepped shape on the surface electrode 10.

In more detail, the bump 6 includes a thinner portion 61 having a relatively small thickness, and a thicker portion 62 having a relatively large thickness. The thicker portion 62 and the thinner portion 61 are formed on the one surface of the substrate 9 such that, when an electronic component is mounted, the thicker portion 62 is positioned on the side closer to a center of the electronic component relative to a corresponding outer terminal 2 when looking at the mounted electronic component in a plan view, and the thinner portion 61 is positioned on the opposite side away from the center of the electronic component relative to the corresponding outer terminal 2 when looking at the mounted electronic component in a plan view. The following description is made in connection with an example in which a bare IC in the form of an electronic component provided with outer terminals is mounted.

Figure 4:
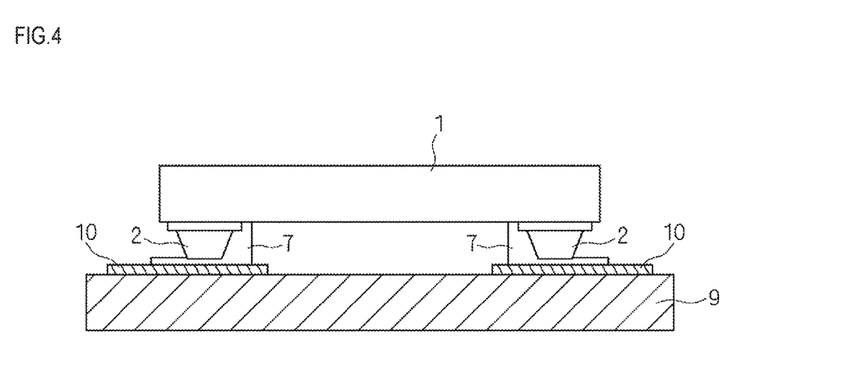
FIG. 4 is a sectional view illustrating a structure of the electronic component module according to the exemplary embodiment.

FIG. 4 is a sectional view illustrating a structure of the electronic component module according to the exemplary embodiment. After aligning the outer terminals 2 of a bare IC 1 to face the bumps 6 on the substrate 9, respectively, the bare IC 1 is placed on the substrate 9, and the outer terminals 2 are joined to the bumps 6, respectively, by applying pressure and heat to such an extent that the bumps 6 are deformed, as illustrated in FIG. 4. The bare IC 1 is thus mounted to the substrate 9.

In this embodiment, a portion joining the outer terminal 2 and the bump 6 to each other through deformation of the bump 6 is denoted by a joining portion 7. The joining portion 7 is formed in a state having a lower height in its region on the opposite side away from the center of the bare IC 1 when looking at the mounted bare IC 1 in a plan view than that in its region on the side closer to the center of the substrate 9 when looking at the mounted bare IC 1 in a plan view. Accordingly, the deformed bump 6 is avoided from extending up to a lateral surface of the bare IC 1. As a result, even when chipping occurs in dicer cutting of the bare IC 1 and an internal wiring of the bare IC 1 is exposed at the lateral surface of the bare IC 1, electrical conduction between the surface electrode 10 of the substrate 9 and the internal wiring of the bare IC 1 is not caused. Hence characteristics of the bare IC 1 do not degrade.

Figure 5:
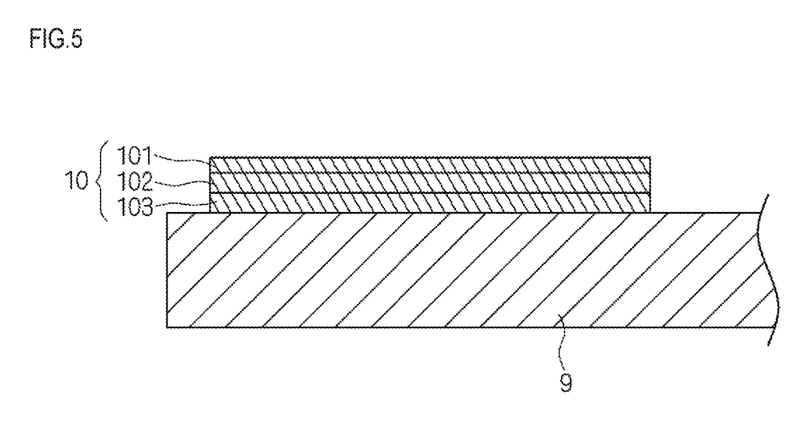
FIG. 5 is an enlarged sectional view illustrating a part of a substrate.

A method of manufacturing the electronic component module according to this embodiment will be described in detail below. FIG. 5 is an enlarged sectional view illustrating a part of the substrate 9. The substrate 9 is formed of a flexible resin. As illustrated in FIG. 5, the surface electrode 10 is provided on the one surface of the substrate 9. The surface electrode 10 is constituted by forming an Au plating 101 over a nickel layer 102 and a copper layer 103, the latter two serving as ground coatings.

The bump 6 is formed in a desired shape on the Au plating 101 by ejecting a metal paste from an ink head. For example, an Ag paste is used as the metal paste. The thinner portion 61 and the thicker portion 62 having different thicknesses from each other can be easily formed by adjusting the number of times the metal paste is ejected.

Of course, a method of forming the bump 6 is not limited to the ink jet method. As another example, the bump 6 may be formed by the screen printing method. When the bump 6 is formed by the screen printing method, it is required to, after forming the thinner portion 61, dry the printed thinner portion 61 and then form the thicker portion 62 on a part of the thinner portion 61 after replacing a screen plate. On the other hand, when the bump 6 is formed by the ink jet method, the thinner portion 61 and the thicker portion 62 can be both formed in a continuous step, and the production cost can be reduced.

The outer terminal 2 of the bare IC 1 has the shape of an inverted truncated cone and is formed by providing an Au wire bump on an Al pad that is an outer electrode of the bare IC 1. In this embodiment, the Au wire bump has an outer diameter of 85 μm and a height of 25 μm. An Au plated bump, a Cu wire bump, or a Cu plated bump may be used instead of the Au wire bump. Furthermore, the outer terminal 2 may be formed in a disk-like shape with a plated bump.

Figure 6:
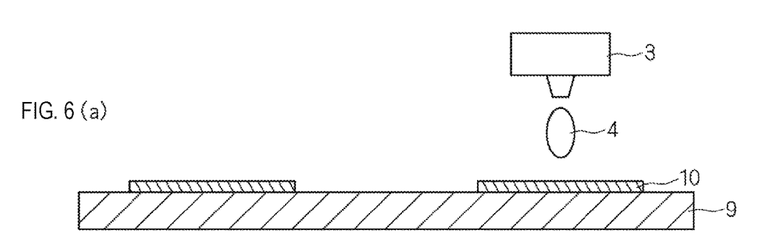
FIGS. 6(a) to 6(e) are schematic sectional views illustrating a method of manufacturing the electronic component module according to the exemplary embodiment.

FIGS. 6(a) to 6(e) are schematic sectional views illustrating a method of manufacturing the electronic component module according to the exemplary embodiment. As illustrated in FIG. 6(a), a metal paste 4 is first ejected from an ink head 3 onto the surface electrode 10 of the substrate 9, thereby forming the thinner portion 61 as illustrated in FIG. 6(b). More specifically, the metal paste 4 is ejected while a table on which the ink head 3 or the substrate 9 is placed is moved. An Ag paste is used as the metal paste 4, and one dot of the Ag paste ejected from the ink head 3 has a volume of 1 pl ($1 \times 10^{-15}$ m$^3$). In this embodiment, the thinner portion 61 having a thickness of 20 μm is formed by ejecting the metal paste 4 two times while the table on which the ink head 3 is placed is moved in the horizontal direction (right-to-left direction in FIG. 6).

Next, the thicker portion 62 is formed as illustrated in FIG. 6(c). When forming the thicker portion 62, the metal paste 4 is ejected eight times while the table on which the ink head 3 is placed is moved in the horizontal direction. As a result, the bump 6 is formed with a thickness of 100 μm in its portion on the side closer to the center of the bare IC 1 when looking at the mounted bare IC 1 in a plan view. The formed bump 6 is then dried. Because the ejected metal paste 4 is a minute droplet, the formed bump 6 may be naturally dried without employing a special drying apparatus.

While a ratio of the thickness of the thicker portion 62 and the thickness of the thinner portion 61 is about 5:1 in this embodiment, the ratio is not limited to such a value. For example, the ratio may be set to, for example, 2:1 insofar as the deformed bump 6 is avoided from extending up to the lateral surface of the bare IC 1 when the bare IC 1 is mounted. Furthermore, in this embodiment, the thicker portion 62 has a width of 50 μm and the thinner portion 61 has a width of 100 μm in the horizontal direction (right-to-left direction in FIG. 6). However, the respective widths of the thicker portion 62 and the thinner portion 61 are not limited to those values, and the width of the thicker portion 62 may be set to 10 μm, for example.

After drying the formed bumps 6, the outer terminals 2 of the bare IC (electronic component provided with outer terminals) 1 are aligned to face the bumps 6 on the substrate 9, respectively. Next, as illustrated in FIG. 6(d), the bare IC 1 is placed on the substrate 9, and the external terminals 2 are joined to the bumps 6, respectively, by applying pressure and heat to such an extent that the bumps 6 are deformed. The bare IC 1 is thus mounted to the substrate 9. In the above-mentioned alignment of the outer terminals 2, a center of each outer terminal 2 of the bare IC 1 is positioned to be not overlapped with the thicker portion 62. With such an arrangement, the deformed bump 6 is made less apt to extend up to the lateral surface of the bare IC 1.

Figure 7:
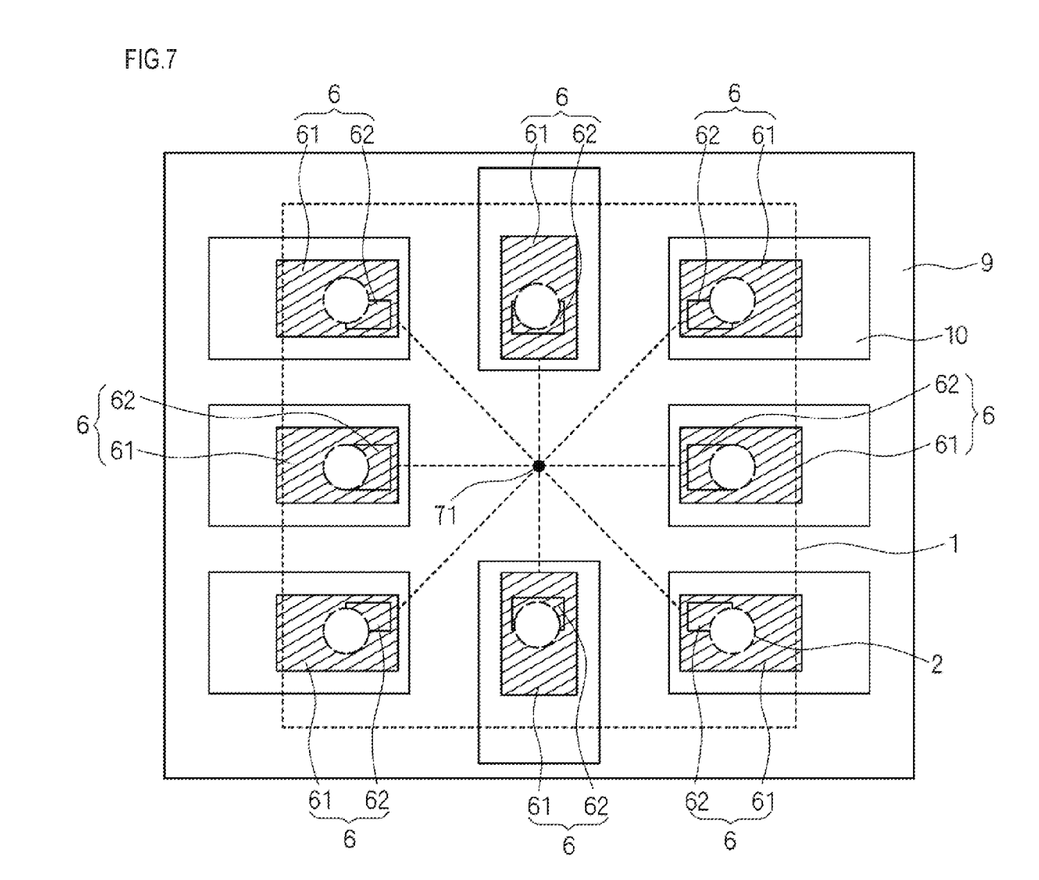
FIG. 7 is a plan seeing-through view illustrating an arrangement of bumps in the electronic component module according to the exemplary embodiment.

FIG. 7 is a plan seeing-through view illustrating an arrangement of the bumps 6 in the electronic component module according to the exemplary embodiment. In FIG. 7, the outer terminals 2 of the bare IC 1 are each denoted by a white circle, and the bumps 6 are each denoted by a hatched area. The plural bumps 6 are arranged in pairs at opposed positions symmetrical with respect to a center 71 of the bare IC 1 when looking at the bare IC 1 in a plan view.

The thicker portions 62 of the bumps 6 are also formed in pairs at opposed positions symmetrical with respect to the center 71 of the bare IC 1 when looking at the bare IC 1 in a plan view. Accordingly, when the bare IC 1 is mounted, a pressing force can be applied in a balanced state, and the plural bumps 6 can be deformed in similar ways. It is hence possible to avoid bonding strength from being locally changed.

Figure 8:
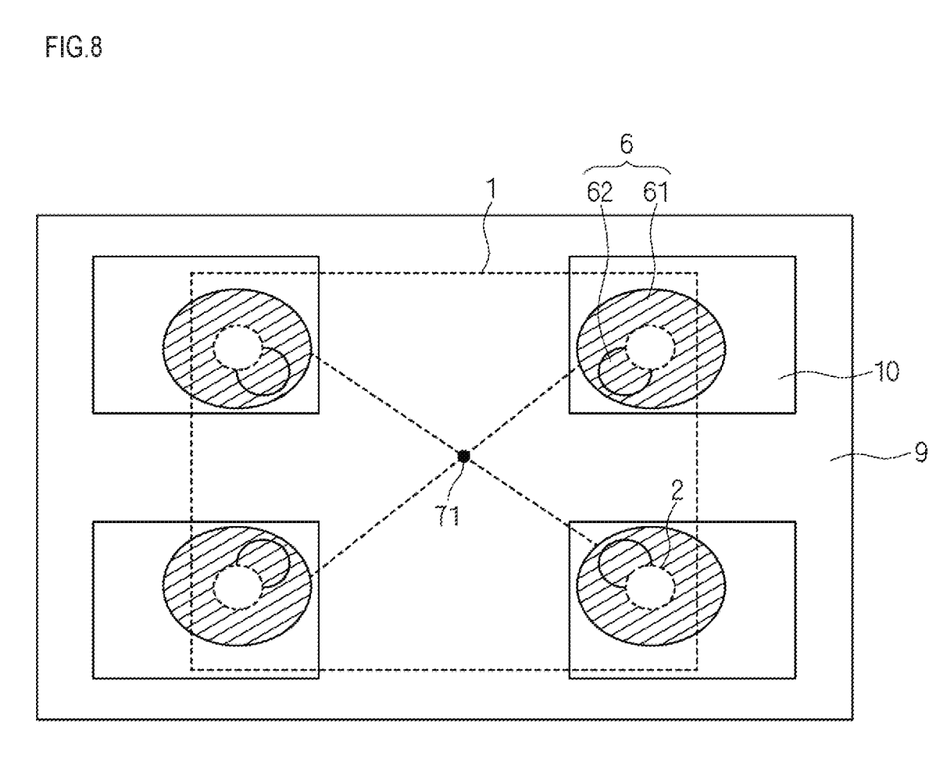
FIG. 8 is a plan seeing-through view illustrating an arrangement of bumps in the electronic component module according to the exemplary embodiment when the bumps have a different shape from that in FIG. 7.

The shape of the bump 6 in a plan view is not limited to a rectangle as illustrated in FIG. 7. FIG. 8 is a plan seeing-through view illustrating an arrangement of the bumps 6 in the electronic component module according to a modification of the exemplary embodiment when the bumps 6 have a different shape from that in FIG. 7. As illustrated in FIG. 8, the bump 6 may have a substantially elliptic shape in a plan view, by forming the thinner portion 61 having a substantially elliptic shape in a plan view, and the thicker portion 62 having a substantially elliptic shape in a plan view. In such a case, the bumps 6 are formed, similarly to the above-mentioned case, in pairs at opposed positions symmetrical with respect to the center 71 of the bare IC 1 when looking at the bare IC 1 in a plan view. Moreover, the thicker portions 62 of the bumps 6 are also formed in pairs at opposed positions symmetrical with respect to the center 71 of the bare IC 1 when looking at the bare IC 1 in a plan view.

Figure 9:
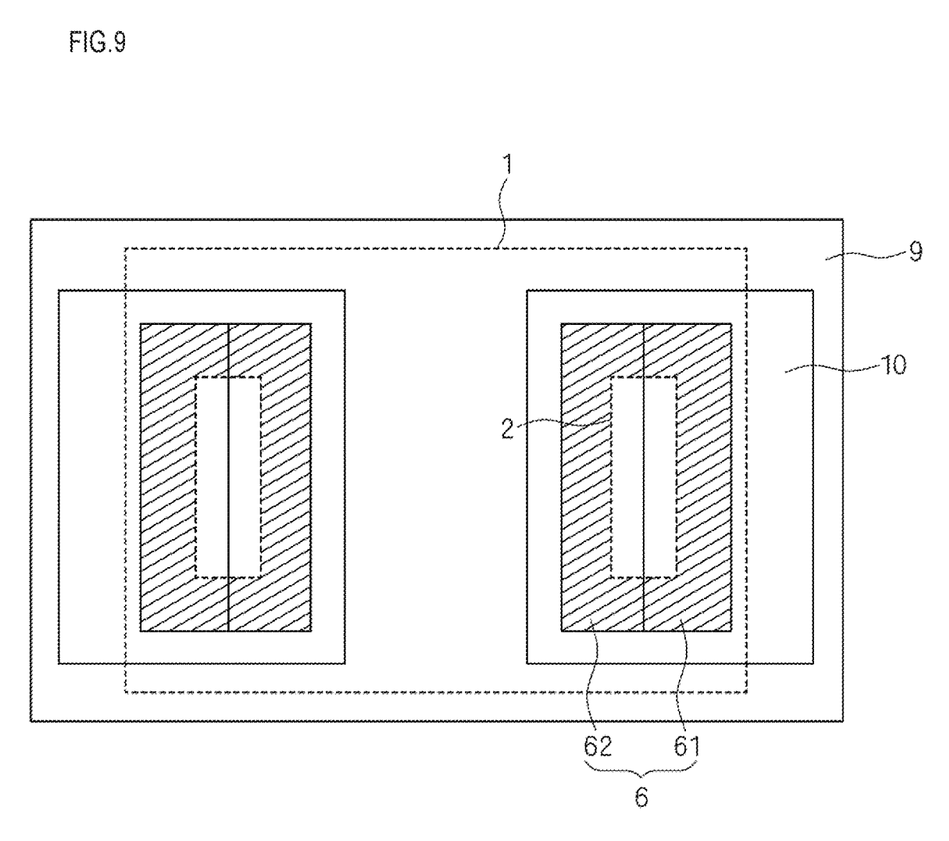
FIG. 9 is a plan seeing-through view illustrating an arrangement of bumps in the electronic component module according to the exemplary embodiment when the bare IC has two outer terminals.

The number of the outer terminals 2 is not limited to any particular one, and the least necessary number of the outer terminals 2 is two. FIG. 9 is a plan seeing-through view illustrating an arrangement of the bumps 6 in the electronic component module according to the embodiment of the present invention when the bare IC 1 has two outer terminals 2.

As illustrated in FIG. 9, when the number of the outer terminals 2 is two, the outer terminals 2 are each formed in a rectangular shape, when viewed in a plan view, in many cases from the viewpoint of mounting the bare IC 1 in a stable state. A similar advantageous effect to that described above is expected by forming the bump 6 in such a stepped shape that the thicker portion 62 is positioned on the side closer to the center of the bare IC 1 when looking at the bare IC 1 in a plan view than a center line of the outer terminal 2 extending in the lengthwise direction thereof, and that the thinner portion 61 is positioned on the opposite side with respect to the center line of the outer terminal 2.

Returning to FIG. 6, the surroundings of the joining portion 7 are finally sealed by an insulating resin 8 as illustrated in FIG. 6(e), whereby the electronic component module is completed.

According to this embodiment, as described above, the plural joining portions 7 joining the plural outer terminals 2 respectively to the plural bumps 6, having been formed in the preceding step, through deformation of the bumps 6 are each formed such that the height of the joining portion 7 on the opposite side away from the center of the bare IC 1 when looking at the bare IC 1 in a plan view is lower than the height of the joining portion 7 on the side closer to the center of the bare IC 1 when looking at the bare IC 1 in a plan view. Therefore, the joining portion 7 is avoided from contacting with the lateral surface of the bare IC 1. Thus, even when the internal wiring of the bare IC 1 is exposed at the lateral surface of the bare IC 1 due to dicer cutting, characteristics of the bare IC 1 do not degrade.

Figure 10A:
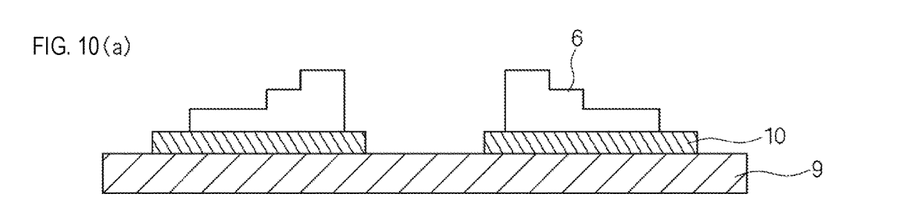
FIGS. 10(a) and 10(b) are sectional views illustrating a structure of the electronic component module, in a state before mounting of the bare IC, according to the exemplary embodiment when the bumps have other different shapes.
Figure 10B:
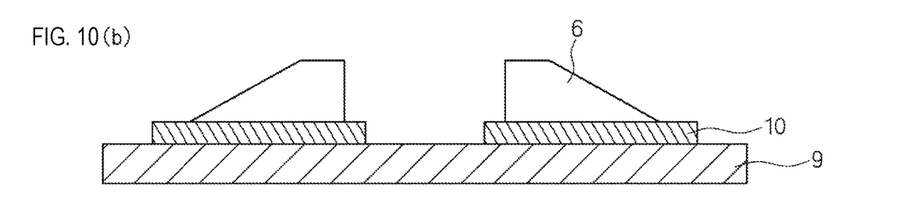

While, in the embodiment described above, the bump 6 is formed in a two-step shape including the thicker portion 62 and the thinner portion 61, the shape of the bump 6 is not particularly limited to the two-step shape. FIGS. 10(a) and 10(b) are sectional views illustrating a structure of the electronic component module, in a state before mounting of the bare IC 1, according to an exemplary embodiment when the bumps 6 have other different shapes.

FIG. 10(a) illustrates an example in which the bump 6 is formed in a three-step shape including a thicker portion, an intermediate portion, and a thinner portion. As a matter of course, the bump 6 is formed such that those three portions have thicknesses gradually increasing toward the side closer to the center of the bare IC 1 when looking at the mounted bare IC 1 in a plan view. Alternatively, when an amount of the metal paste 4 ejected from the ink head 3 can be finely controlled, the bump 6 may be formed in a sloped shape having a thickness that gradually increases toward the side closer to the center of the bare IC 1 when looking at the mounted bare IC 1 in a plan view, as illustrated in FIG. 10(b).

An embodiment consistent with the present disclosure is not limited to the above-described embodiment, and it may be variously modified and improved without departing from the scope of the present disclosure. For example, applications of the present invention are not limited to an electronic component module in which an electronic component, e.g., a bare IC, is mounted to a substrate, and embodiments according to the present disclosure is also applicable to an electronic component module in which a medium-sized electronic component incorporating a small-sized electronic component therein is mounted to a substrate. As one example, the present disclosure can be applied to an electronic component module in which, after resin-molding a small-sized electronic component together with a substrate, an electromagnetic shield portion is formed on a top surface or a lateral surface of the electronic component module.

With the features of the method of manufacturing an electronic component module described above, each of the plural bumps includes the thicker portion having the relatively large thickness and the thinner portion having the relatively small thickness. Each bump is formed on one surface of the substrate such that, when looking at the electronic component in a mounted state in a plan view, the thicker portion is positioned on the side closer to the center of the electronic component relative to the corresponding outer terminal, and the thinner portion is positioned on the opposite side away from the center of the electronic component relative to the corresponding outer terminal. The plural joining portions joining the plural outer terminals respectively to the plural bumps, having been formed in the preceding step, through deformation of the bumps are formed such that the height of each joining portion on the opposite side away from the center of the electronic component when looking at the mounted electronic component in a plan view is lower than the height of the joining portion on the side closer to the center of the electronic component. Therefore, the joining portions are avoided from contacting with the lateral surfaces of the electronic component. Thus, even when the internal wiring of the electronic component is exposed at the lateral surfaces of the electronic component due to dicer cutting, characteristics of the electronic component do not degrade.

With the feature mentioned above, since the plural joining portions are formed such that the height of each joining portion on the opposite side away from the center of the electronic component when looking at the electronic component in a plan view is lower than the height of the joining portion on the side closer to the center of the electronic component, the joining portions are avoided from contacting with the lateral surfaces of the electronic component. Thus, even when the internal wiring of the electronic component is exposed at the lateral surfaces of the electronic component due to dicer cutting, characteristics of the electronic component do not degrade.

In an embodiment of the disclosed method of manufacturing the electronic component module in which, preferably, the plural bumps are each formed in a stepped shape, since the plural bumps are each formed in a stepped shape, the joining portions can be formed such that the height of each joining portion on the opposite side away from the center of the electronic component when looking at the mounted electronic component in a plan view is lower than the height of the joining portion on the side closer to the center of the electronic component. Therefore, the joining portions are avoided from contacting with the lateral surfaces of the electronic component. Thus, even when the internal wiring of the electronic component is exposed at the lateral surfaces of the electronic component due to dicer cutting, characteristics of the electronic component do not degrade.

In an embodiment of the method of manufacturing the electronic component module in which, preferably, the plural bumps are formed by an ink jet method, since the plural bumps are formed by an ink jet method, the thinner portion and the thicker portion having different thicknesses can be easily formed by adjusting the number of times a metal paste is ejected. Furthermore, the thinner portion and the thicker portion can be both formed in a continuous step, and the production cost can be reduced.

With the feature of the electronic component mentioned above, since the plural joining portions are formed such that the height of each joining portion on the opposite side away from the center of the electronic component when looking at the electronic component in a plan view is lower than the height of the joining portion on the side closer to the center of the electronic component, the joining portions are avoided from contacting with the lateral surfaces of the electronic component. Thus, even when the internal wiring of the electronic component is exposed at the lateral surfaces of the electronic component due to dicer cutting, characteristics of the electronic component do not degrade.

In embodiment of the electronic component module where the plural bumps are formed in pairs at opposed positions symmetrical with respect to the center of the electronic component when looking at the electronic component in a plan view, since the plural bumps are formed in pairs at opposed positions symmetrical with respect to the center of the electronic component when looking at the electronic component in a plan view, a pressing force can be applied in a balanced state and the plural bumps can be deformed evenly when the electronic component is mounted. It is hence possible to avoid bonding strength from being locally changed.

That which is claimed is:

1. An electronic component module comprising:
a substrate;
a plurality of bumps provided on one surface of the substrate;
a bare IC having a plurality of outer terminals; and
a resin sealing surroundings of a plurality of joining portions which join the plural outer terminals respectively to the plurality of bumps through deformation of the bumps,
wherein the plurality of joining portions are formed such that a height of each joining portion on an opposite side farthest away from a center of the bare IC when looking at the electronic component module in a plan view is lower than a height of the joining portion on a side closest to the center of the bare IC,
wherein a top surface of each of the plurality of joining portions is in direct contact with a bottom surface of the bare IC, and
wherein each of the plurality of joining portions on the opposite side furthest away from the center of the bare IC extends beyond the bare IC when looking at the electronic component module in the plan view.

2. The electronic component module according to claim 1, wherein the plurality of bumps are formed in pairs at opposed positions symmetrical with respect to the center of the bare IC when looking at the bare IC in the plan view,
wherein each of the plurality of joining portions has a thicker portion and a thinner portion, and
wherein the thicker potion is located closer to the center of the bare IC than the thinner portion.

3. The electronic component module according to claim 2, wherein each of the bumps is formed in a three-step shape including a thicker portion, an intermediate portion, and a thinner portion, and the thicker portion, the intermediate portion, and the thinner portion are arranged in thicknesses gradually increasing toward a side closer to the center of the bare IC when looking at the bare IC in the plan view.

4. The electronic component module according to claim 2, wherein each of the bumps is formed in a sloped shape having a thickness that gradually increases toward a side closer to the center of the bare IC when looking at the bare IC in the plan view.

5. The electronic component module according to claim 1, wherein only a lower portion of each joining portion contacting an outermost surface of one of the plurality of outer terminals extends laterally away from the center of the bare IC, and
wherein an upper portion of each joining portion does not extend laterally away from the outermost surface of one of the plurality of outer terminals.

6. The electronic component module according to claim 1, wherein each of the plurality of joining portions has a thicker portion and a thinner portion, and
wherein a ratio of a thickness of the thicker portion to a thickness of the thinner portion is about 2:1 or greater.

7. The electronic component module according to claim 1, wherein each of the plurality of outer terminals is connected with only a corresponding one of the plurality of joining portions.

8. An electronic component module comprising:
a substrate;
a plurality of bumps provided on one surface of the substrate;
a bare IC having a plurality of outer terminals; and
a resin sealing surroundings of a plurality of joining portions which join the plural outer terminals respectively to the plurality of bumps through deformation of the bumps,
wherein the plurality of joining portions are formed such that a height of each joining portion on an opposite side farthest away from a center of the bare IC when looking at the electronic component module in a plan view is lower than a height of the joining portion on a side closest to the center of the bare IC,
wherein a top surface of each of the plurality of joining portions is in direct contact with a bottom surface of the bare IC, and
wherein, in a vertical cross-section through the electronic component module,
a portion of the bare IC is formed over a portion of one of the plurality of outer terminals,
the portion of the bare IC is formed over a portion of the resin,
the portion of the bare IC is formed over a portion of one of the plurality of joining portions on the opposite side furthest away from the center of the bare IC when looking at the electronic component module in the plan view, and
the portion of the bare IC is formed over the one surface of the substrate.

9. The electronic component module according to claim 1, wherein at least a majority of an external surface of at least one of the plurality of outer terminals when viewed from above in a horizontal cross-section through the plurality of outer terminals is free from contact with a thicker portion of a corresponding one of the plurality of bumps.

* * * * *